United States Patent
Hsieh et al.

(10) Patent No.: US 10,373,829 B1
(45) Date of Patent: Aug. 6, 2019

(54) PATTERNING METHOD

(71) Applicant: UNITED MICROELECTRONICS CORP., Hsin-Chu (TW)

(72) Inventors: Tsung-Yin Hsieh, Tainan (TW); Chih-Sheng Chang, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/052,625

(22) Filed: Aug. 2, 2018

(30) Foreign Application Priority Data

Jul. 3, 2018 (TW) .............................. 107122961 A

(51) Int. Cl.
- *H01L 21/033* (2006.01)
- *H01L 21/768* (2006.01)
- *H01L 21/311* (2006.01)

(52) U.S. Cl.
CPC ...... *H01L 21/0338* (2013.01); *H01L 21/0332* (2013.01); *H01L 21/0337* (2013.01); *H01L 21/31144* (2013.01); *H01L 21/76816* (2013.01); *H01L 21/76877* (2013.01)

(58) Field of Classification Search
None
See application file for complete search history.

(56) References Cited

U.S. PATENT DOCUMENTS

| 8,667,443 | B2 | 3/2014 | Smayling | |
|---|---|---|---|---|
| 10,236,256 | B2* | 3/2019 | Zhang | H01L 21/76883 |
| 2018/0342421 | A1* | 11/2018 | Bombardier | H01L 21/76897 |
| 2019/0051523 | A1* | 2/2019 | Huang | H01L 21/0338 |

* cited by examiner

*Primary Examiner* — Asok K Sarkar
(74) *Attorney, Agent, or Firm* — Winston Hsu

(57) ABSTRACT

A patterning method includes the following steps. A layout pattern is provided to a computer system. The layout pattern includes stripe patterns, and each of the stripe patterns extends in a first direction. Mandrel patterns are formed corresponding to a part of the stripe patterns. Each of the mandrel patterns extends in the first direction. A modification is performed to the mandrel patterns for elongating at least a part of the mandrel patterns in the first direction. Ends of the mandrel patterns in the first direction are aligned in a second direction perpendicular to the first direction after the modification. The mandrel patterns are outputted to a photomask after the modification. A photolithography process using the photomask is performed for forming a patterned structure on a substrate. By performing the modification to the mandrel patterns, design flexibility of the layout pattern corresponding to the patterning method may be enhanced.

17 Claims, 22 Drawing Sheets

PATTERNING METHOD

BACKGROUND OF THE INVENTION

1. Field of the Invention

The present invention relates to a patterning method, and more particularly, to a patterning method including a modification performed to mandrel patterns.

2. Description of the Prior Art

The integrated circuit (IC) is constructed by devices and interconnections, which are formed by patterned feature in a substrate or in different layers. In the fabrication of IC, photolithography process has been an essential technique. The photolithography process is applied to form designed patterns such as layout patterns on one or more photomask, and then to transfer such patterns to a photoresist layer on a film by exposure and development steps for precisely transferring the complicated layout pattern to a semiconductor chip.

Along with miniaturization of semiconductor devices and progress in fabrication of semiconductor device, the conventional lithography process meets the bottleneck and the limitation. Therefore, the double patterning technique is developed for manufacturing semiconductor devices with a further smaller dimension. Generally, the double patterning technique includes a litho-etch-litho-etch (LELE) double patterning approach, a litho-freeze-litho-etch (LFLE) double patterning approach, and a self-aligned double patterning (SADP) approach. In the SADP approach, a sidewall spacer is formed on sidewalls of a feature formed by a photo-etching process, the feature is then removed, and the pattern of the spacer is then transferred to a material layer underneath the spacer for forming a pattern with a smaller critical dimension. However, some layout patterns cannot be directly formed by the SADP approach because of the special method of the SADP approach, and the application of the SADP approach is limited accordingly.

SUMMARY OF THE INVENTION

A patterning method is provided in the present invention. A modification is performed to mandrel patterns for elongating at least a part of the mandrel patterns, and ends of the mandrel patterns are aligned with one another after the modification. By using the patterning method of the present invention, defects generated when layout patterns are directly applied to a self-aligned double patterning method may be improved, and design flexibility of the layout pattern corresponding to the patterning method may be enhanced accordingly.

According to an embodiment of the present invention, a patterning method is provided. The patterning method includes the following steps. A layout pattern is provided to a computer system. The layout pattern includes stripe patterns, and each of the stripe patterns extends in a first direction. Mandrel patterns are formed corresponding to a part of the stripe patterns, and each of the mandrel patterns extends in the first direction. A modification is performed to the mandrel patterns for elongating at least a part of the mandrel patterns in the first direction. Ends of the mandrel patterns in the first direction are aligned with one another in a second direction perpendicular to the first direction after the modification. The mandrel patterns are outputted to a photomask after the modification. A photolithography process using the photomask is performed for forming a patterned structure on a substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-14 are schematic drawings illustrating the patterning method according to the first embodiment of the present invention, wherein FIG. 3 is a schematic drawing in a step subsequent to FIG. 2, FIG. 4 is a schematic drawing in a step subsequent to FIG. 3, FIG. 5 is a schematic top view diagram of a photomask according to the first embodiment of the present invention, FIG. 6 is a schematic top view diagram of a substrate according to the first embodiment of the present invention, FIG. 7 is a schematic drawing in a step subsequent to FIG. 6, FIG. 8 is a cross-sectional diagram taken along a line A-A' in FIG. 7, FIG. 9 is a schematic drawing in a step subsequent to FIG. 7, FIG. 10 is a cross-sectional diagram taken along a line B-B' in FIG. 9, FIG. 11 is a schematic drawing in a step subsequent to FIG. 9, FIG. 12 is a cross-sectional diagram taken along a line C-C' in FIG. 11, FIG. 13 is a schematic drawing in a step subsequent to FIG. 11, and FIG. 14 is a cross-sectional diagram taken along a line D-D' in FIG. 13.

FIGS. 15-18 are schematic drawings illustrating a patterning method according to a second embodiment of the present invention, wherein FIG. 16 is a schematic drawing in a step subsequent to FIG. 15, FIG. 17 is a schematic drawing in a step subsequent to FIG. 16, and FIG. 18 is a schematic drawing in a step subsequent to FIG. 17.

FIGS. 20-22 are schematic drawings illustrating the patterning method according to the third embodiment of the present invention, wherein FIG. 21 is a schematic drawing in a step subsequent to FIG. 20, and FIG. 22 is a schematic drawing in a step subsequent to FIG. 21.

DETAILED DESCRIPTION

Figure 1:
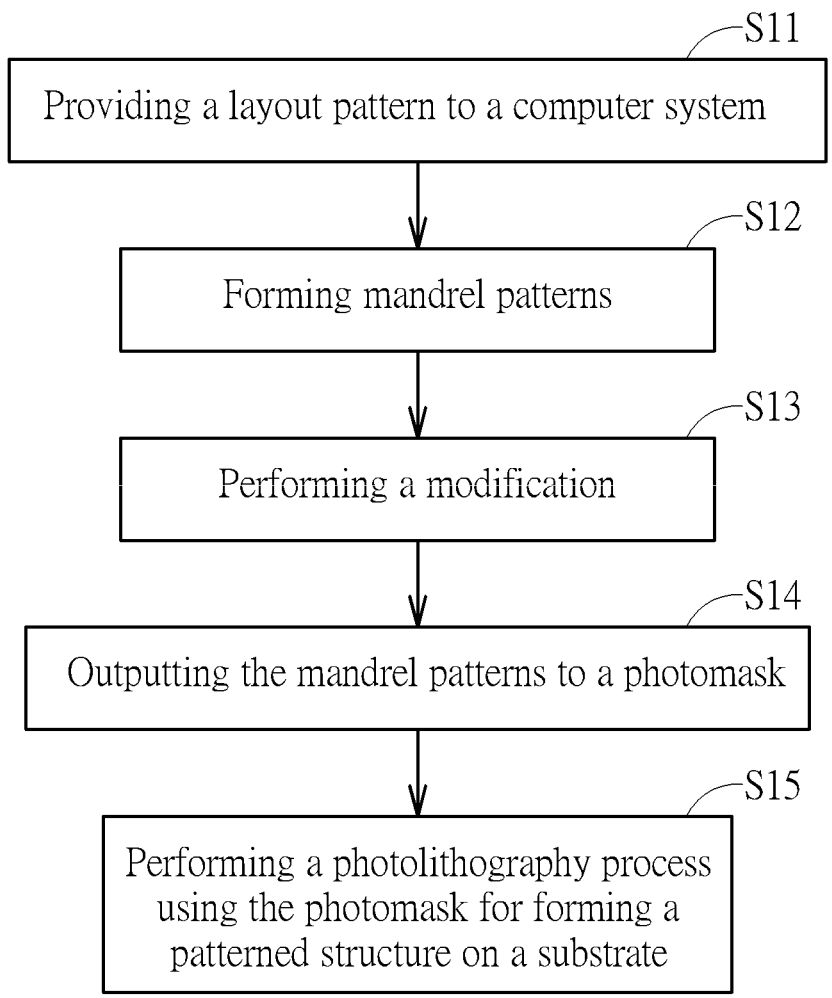
FIG. 1 is a flow chart of a patterning method according to a first embodiment of the present invention.
Figure 2:
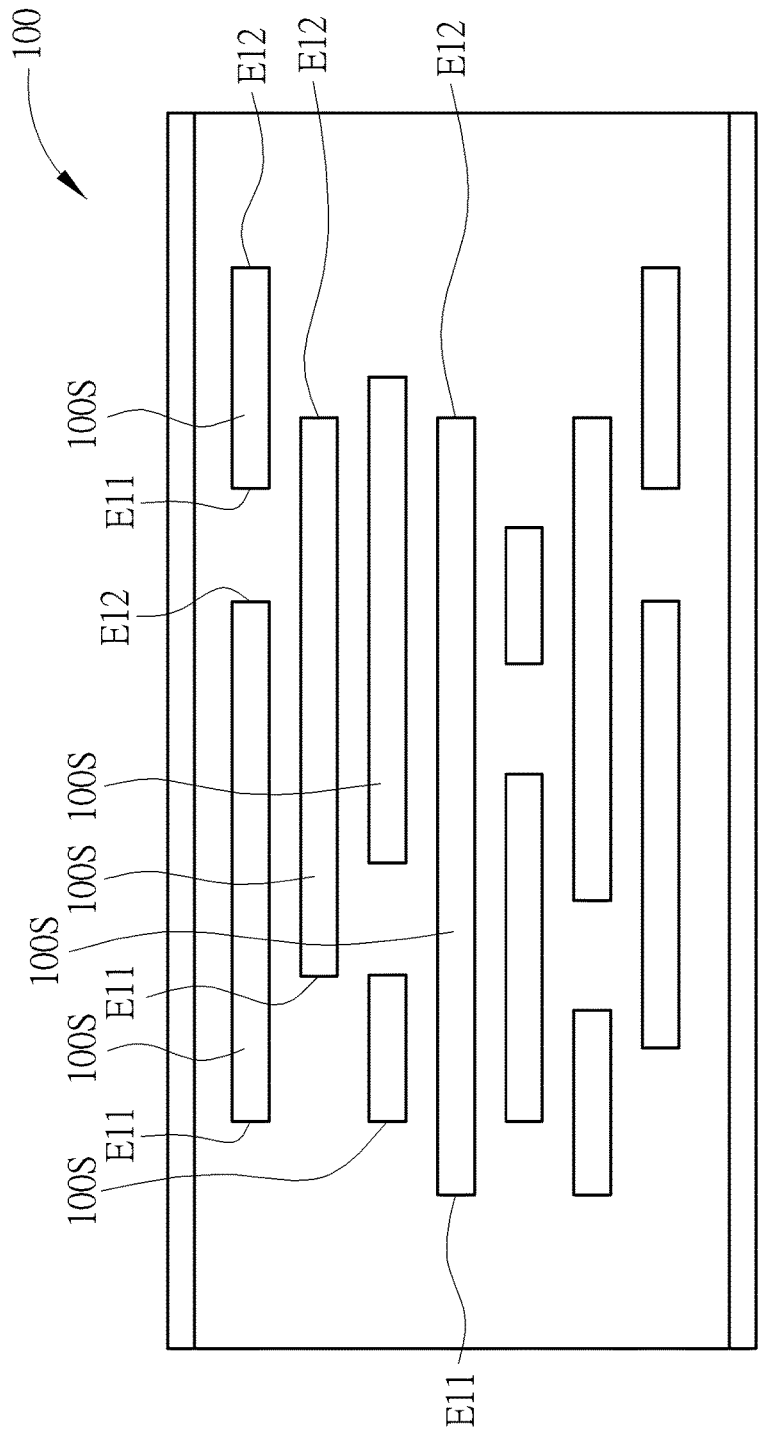
Figure 3:
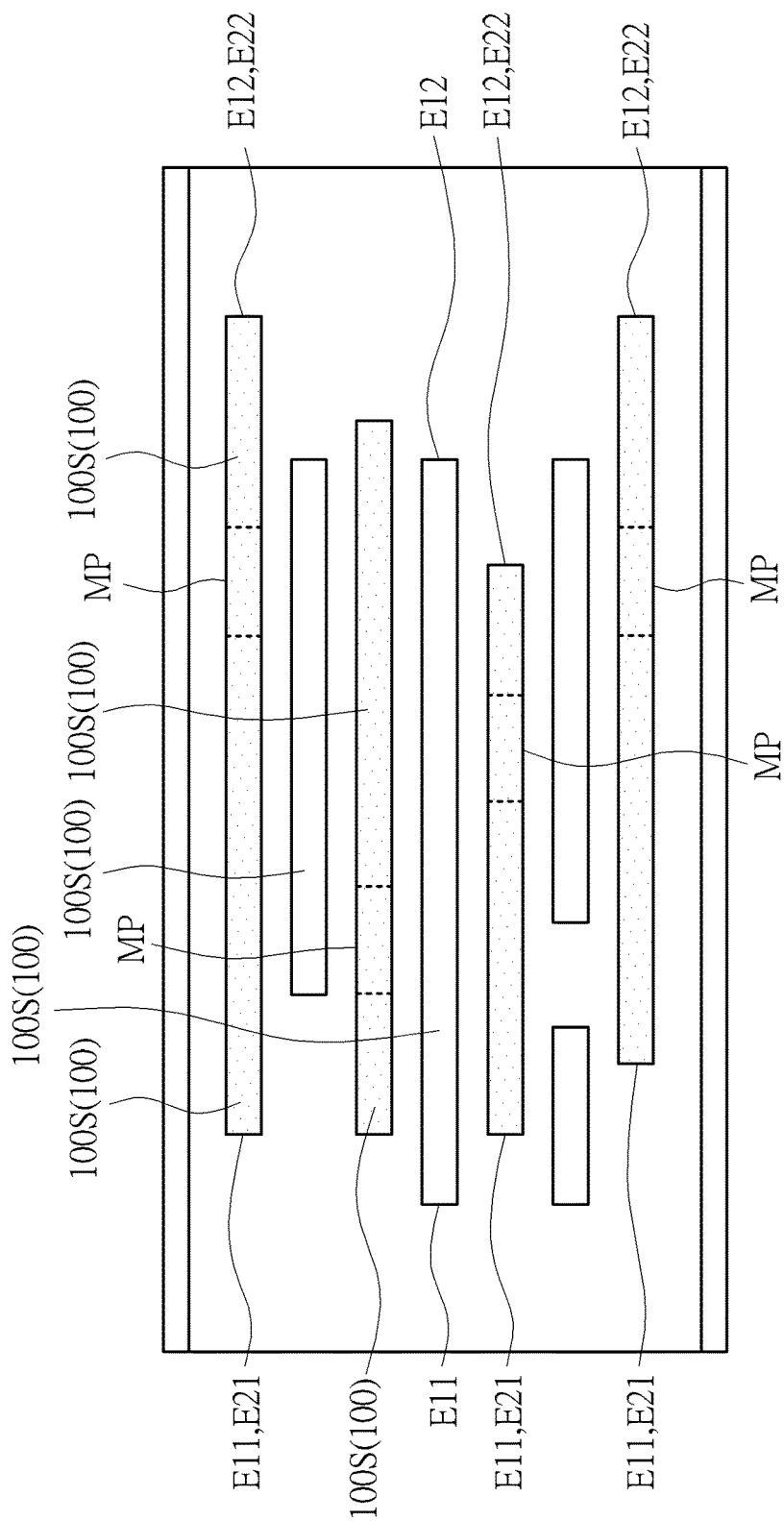
Figure 4:
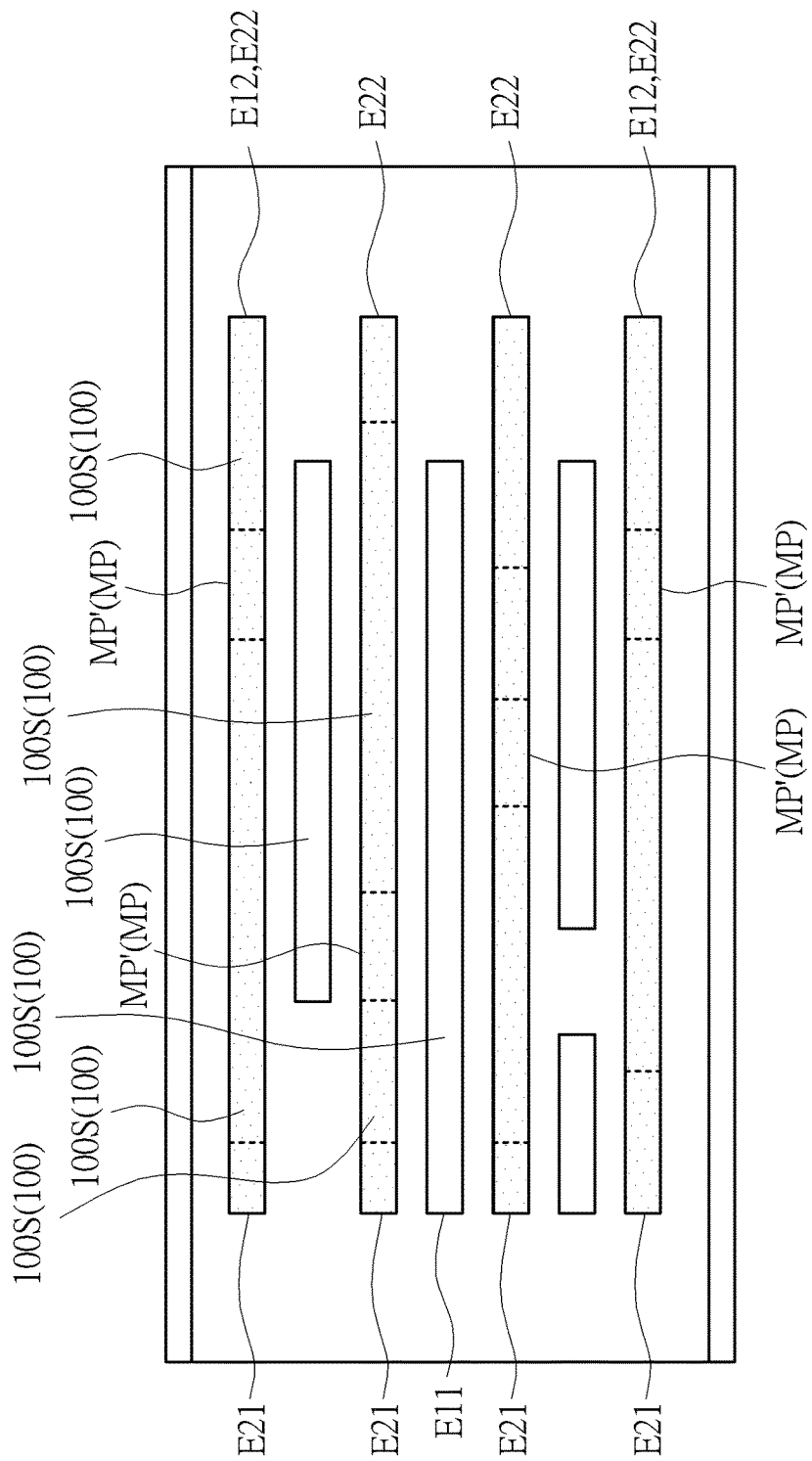
Figure 4:
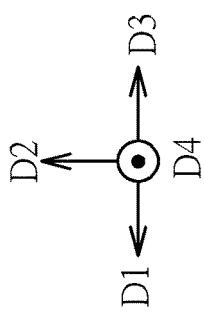
Figure 5:
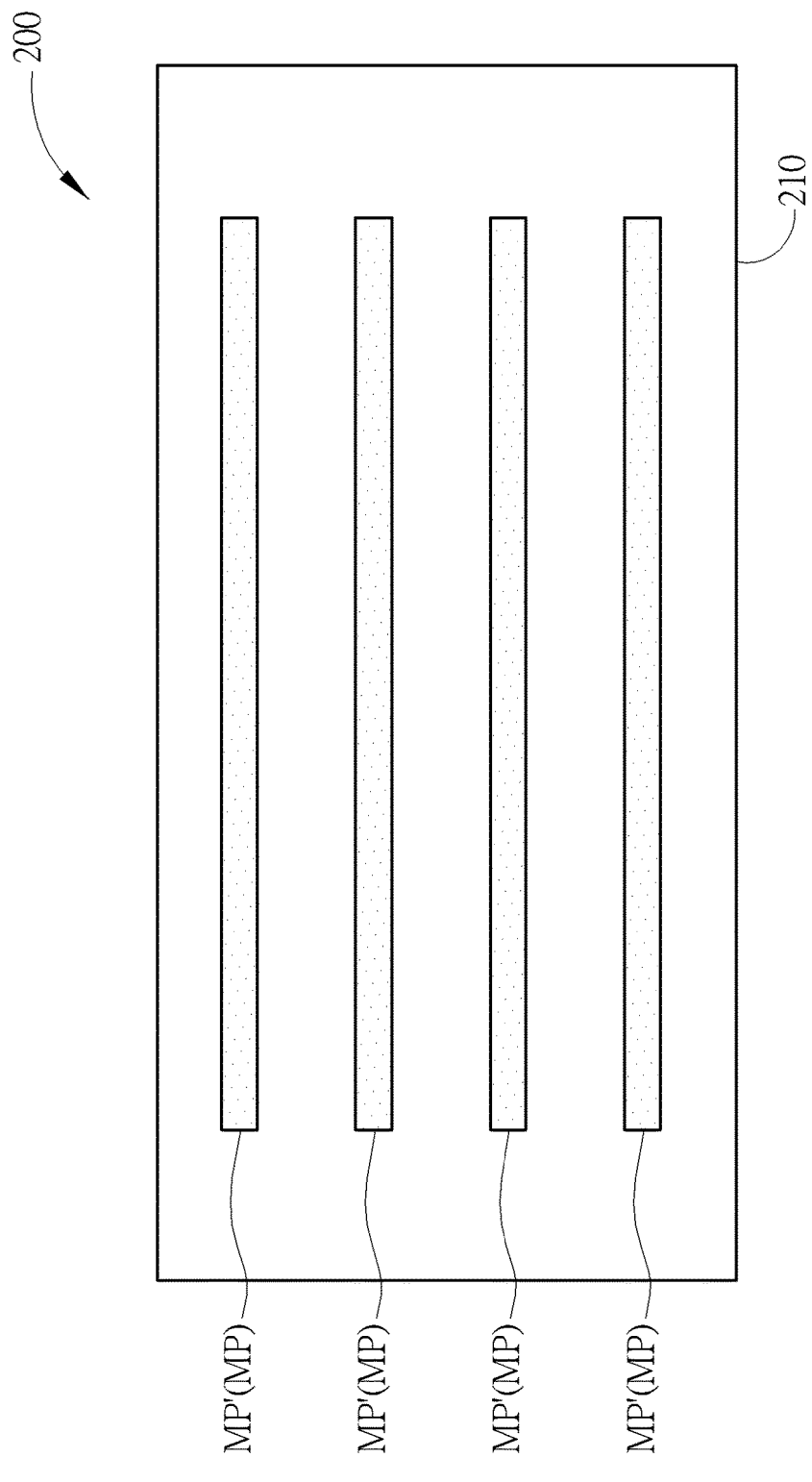
Figure 6:
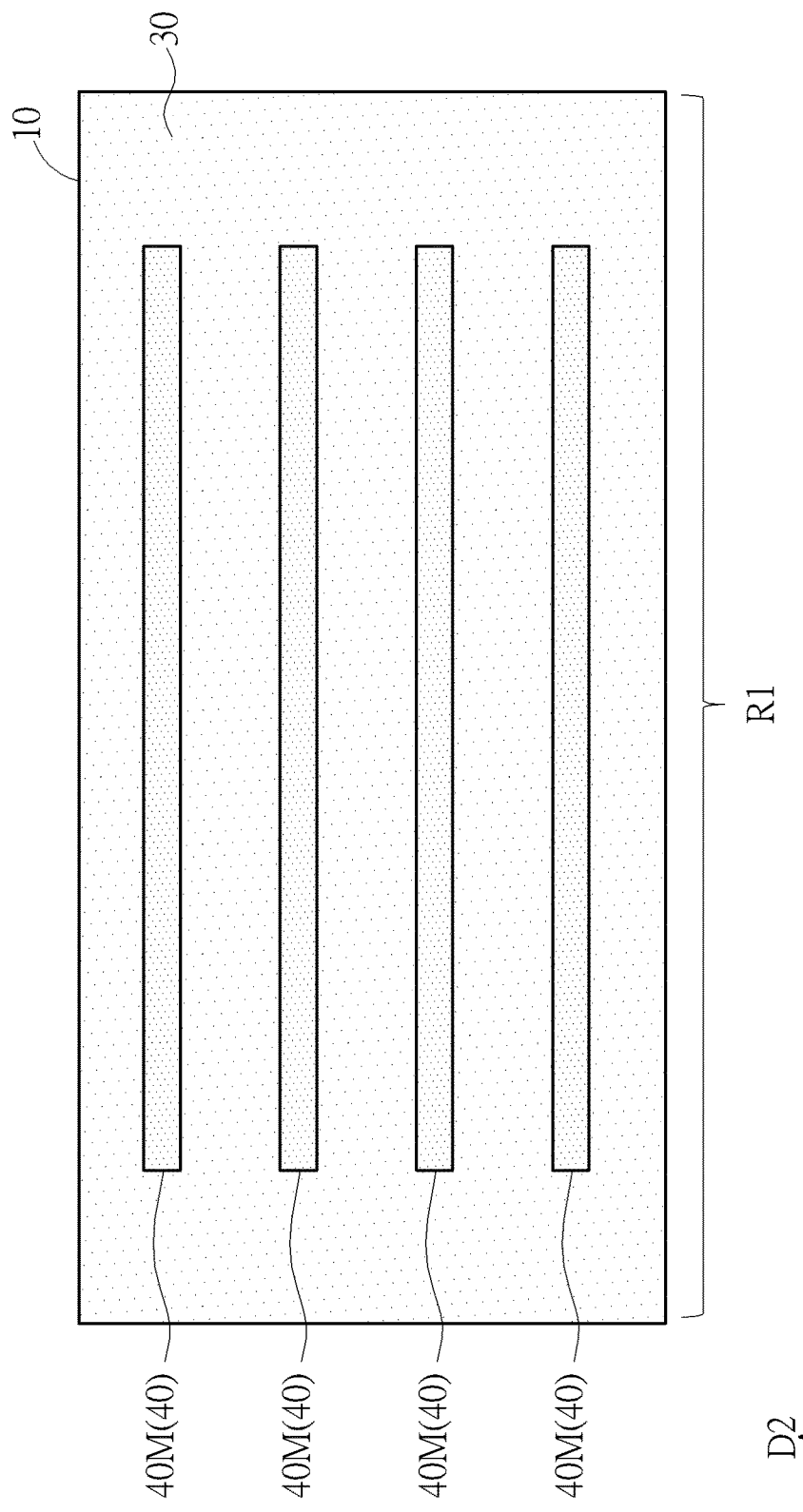
Figure 7:
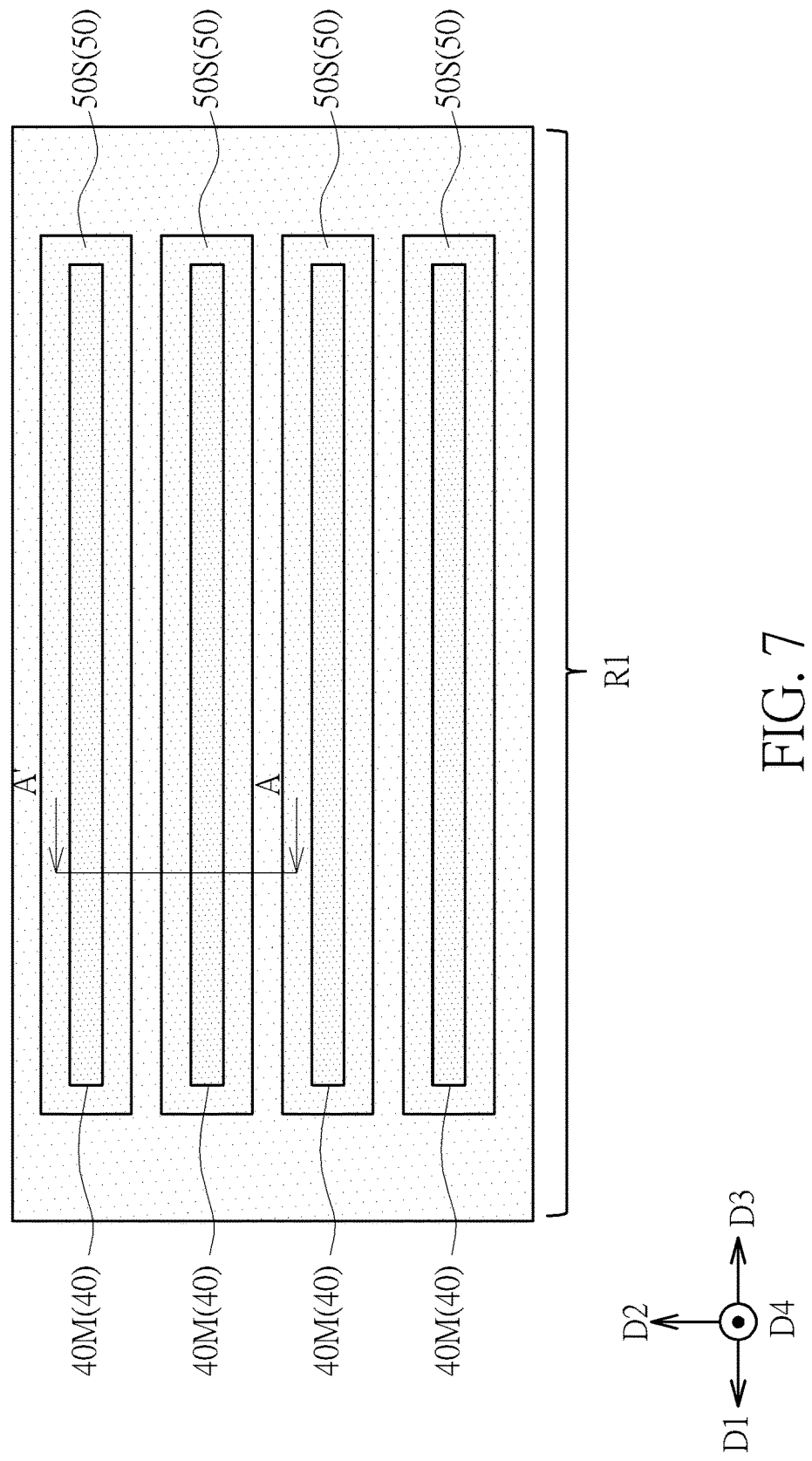
Figure 8:
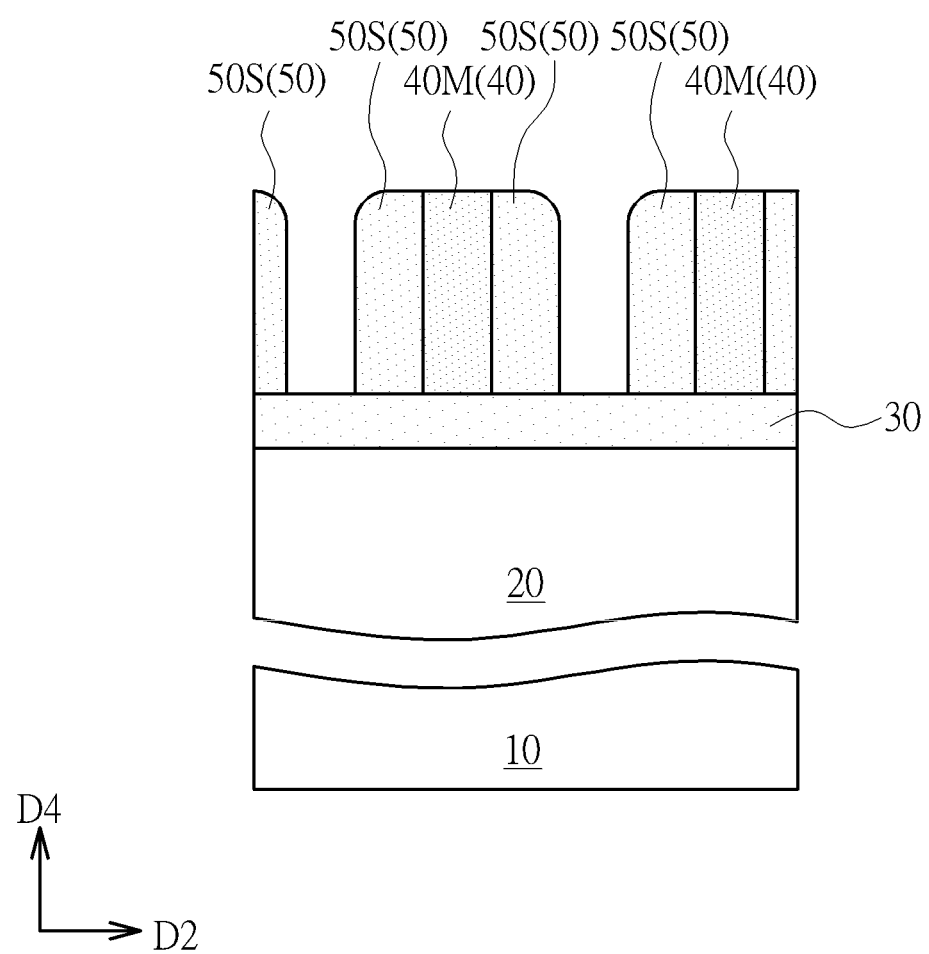
Figure 9:
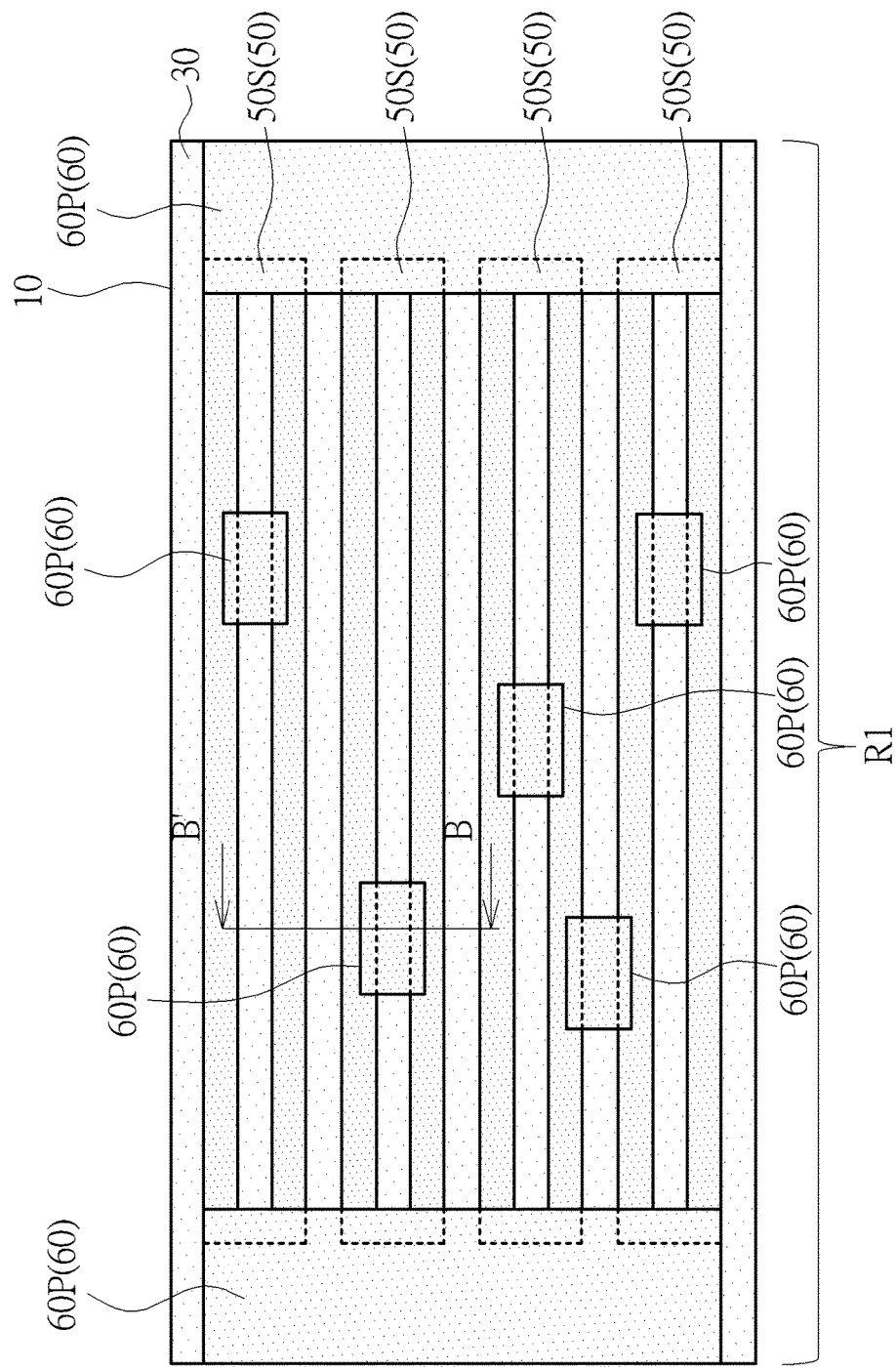
Figure 9:
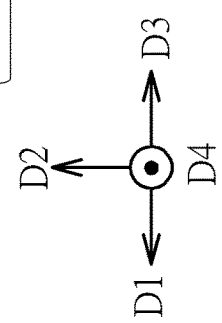
Figure 10:
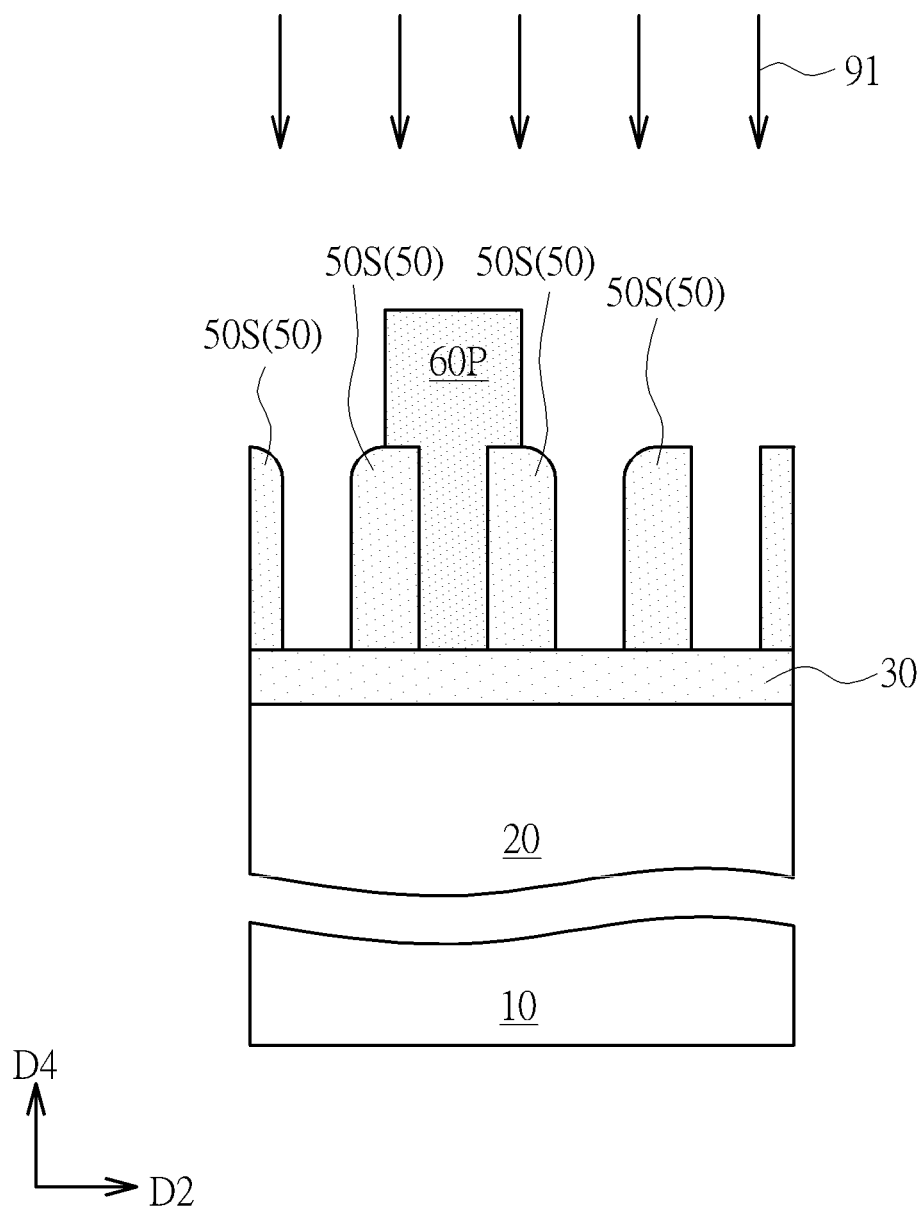
Figure 11:
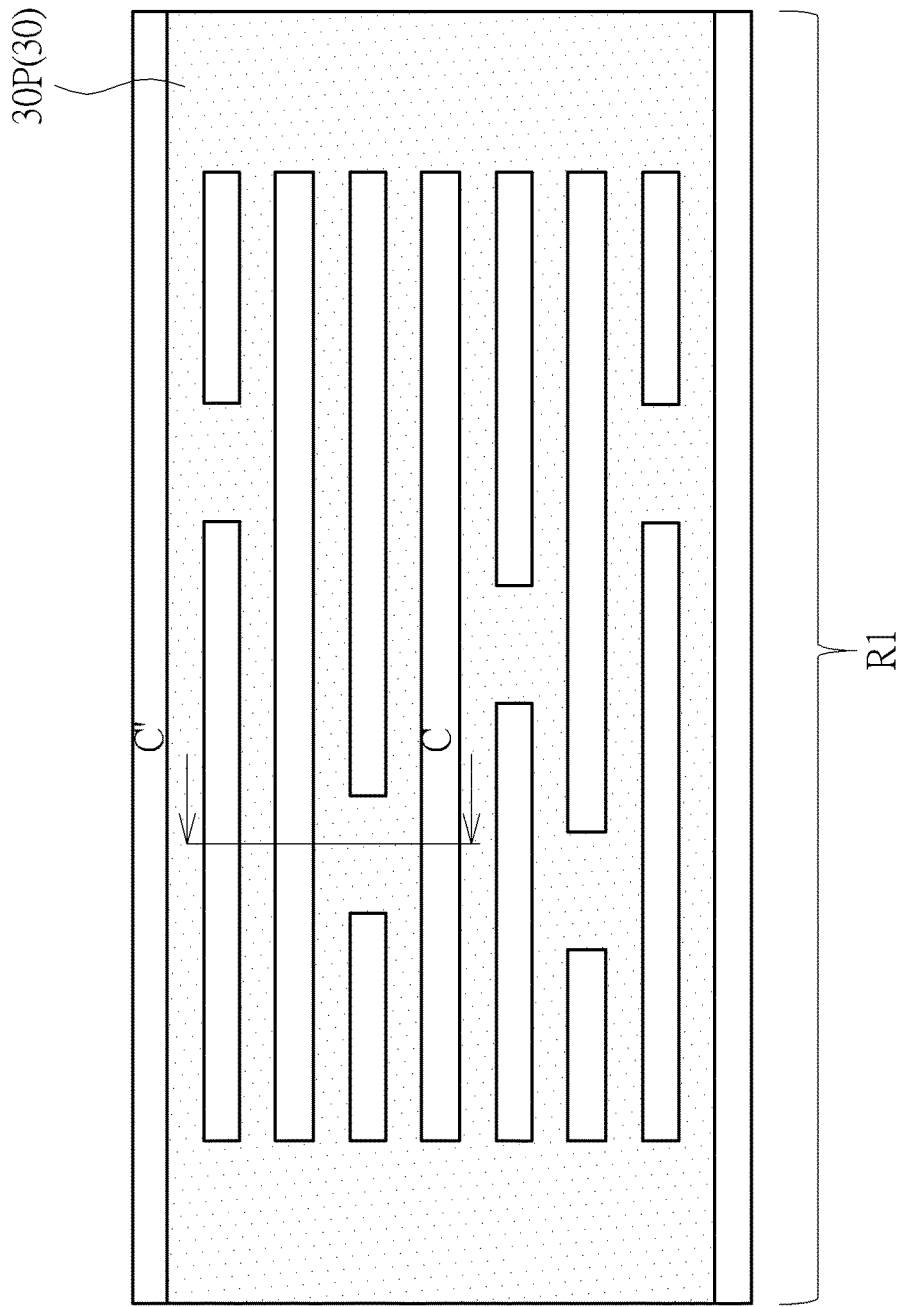
Figure 12:
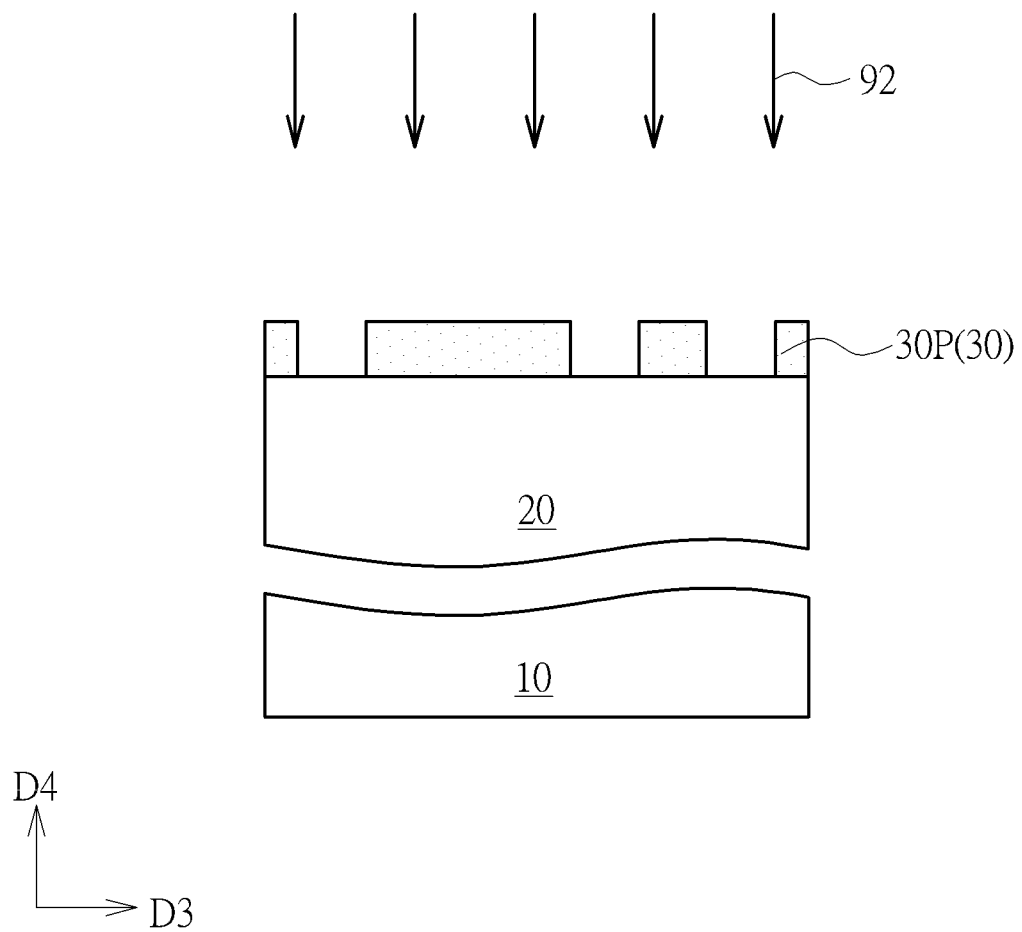
Figure 13:
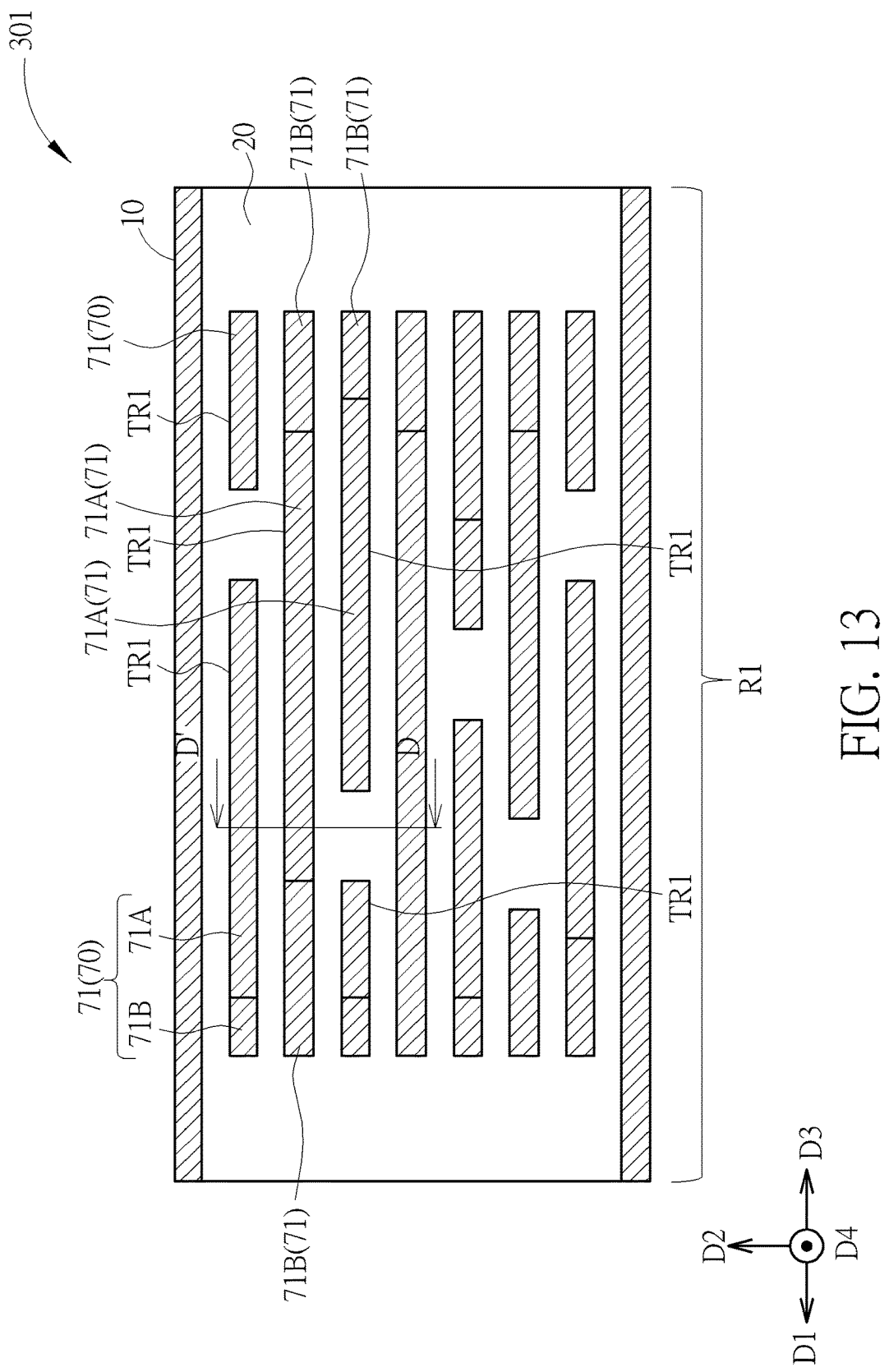
Figure 14:
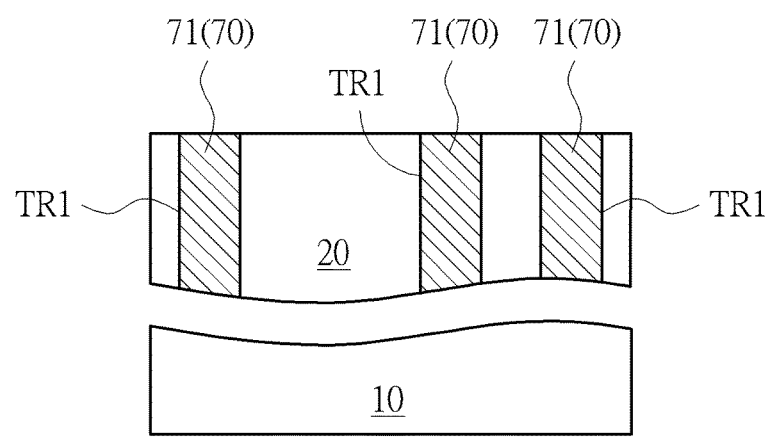
Figure 14:
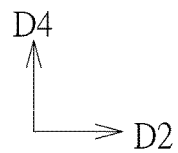

Please refer to FIGS. 1-14. FIG. 1 is a flow chart of a patterning method according to a first embodiment of the present invention, and FIGS. 2-14 are schematic drawings illustrating the patterning method in this embodiment, wherein FIGS. 2-7, 9, 11, and are top view diagrams, and FIGS. 8, 10, 12, and 14 are cross-sectional diagrams. FIG. 3 is a schematic drawing in a step subsequent to FIG. 2, FIG. 4 is a schematic drawing in a step subsequent to FIG. 3, FIG. 5 is a schematic top view diagram of a photomask in this embodiment, FIG. 6 is a schematic top view diagram of a substrate in this embodiment, FIG. 7 is a schematic drawing in a step subsequent to FIG. 6, FIG. 8 is a cross-sectional diagram taken along a line A-A' in FIG. 7, FIG. 9 is a schematic drawing in a step subsequent to FIG. 7, FIG. 10 is a cross-sectional diagram taken along a line B-B' in FIG. 9, FIG. 11 is a schematic drawing in a step subsequent to FIG. 9, FIG. 12 is a cross-sectional diagram taken along a line C-C' in FIG. 11, FIG. 13 is a schematic drawing in a step subsequent to FIG. 11, and FIG. 14 is a cross-sectional diagram taken along a line D-D' in FIG. 13. The patterning method in this embodiment may include the following steps.

As shown in FIG. 1 and FIG. 2, in step S11, a layout pattern 100 is provided to a computer system. The layout pattern 100 includes a plurality of stripe patterns 100S, and each of the stripe patterns 100S extends in a first direction D1. In some embodiments, two of the stripe patterns 100S may be adjacent to each other in a second direction D2, and the second direction D2 is perpendicular to the first direction D1. In addition, each of the stripe patterns 100S may have a first end E11 and a second end E12 opposite to the first end E11. The first end E11 of each of the stripe patterns 100S may be an end of the stripe pattern 100S in the first direction D1, and the second end E12 of each of the stripe patterns 100S may be an end of the stripe pattern 100S in a third direction D3 opposite to the first direction D1. Two of the stripe patterns 100S are adjacent to each other in the second direction D2, ends of this two stripe patterns 100S in the first direction D1 (i.e. the first ends E11 of this two stripe patterns 100S) may not be aligned with each other in the second direction D2, and ends of this two stripe patterns 100S in the third direction D3 (i.e. the second ends E12 of this two stripe patterns 100S) may not be aligned with each other in the second direction D2, but not limited thereto. Additionally, in some embodiments, some of the stripe patterns 100S may be located adjacent to one another in the first direction D1, but not limited thereto. In other words, some of the stripe patterns 100s may be located at the same row in FIG. 2, the first ends E11 of the stripe patterns 100S located at the leftmost sides of all rows may not be aligned with one another in the second direction D2, and the second ends E12 of the stripe patterns 100S located at the rightmost sides of all rows may not be aligned with one another in the second direction D2. In some embodiments, the stripe patterns 100S in the layout pattern 100 may be a layout pattern design of parts in a semiconductor device, such as a layout pattern design of a interconnection structure formed in a back end of line (BEOL) process of a semiconductor device, but not limited thereto.

Subsequently, as shown in FIGS. 1-3, step S12 is carried out for forming a plurality of mandrel patterns MP. The mandrel patterns MP are formed corresponding to a part of the stripe patterns 100S, and each of the mandrel patterns MP extends in the first direction D1. Specifically, each of the mandrel patterns MP may have a third end E21 and a fourth end E22 opposite to the third end E21. The third end E21 of each of the mandrel patterns MP may be an end of the mandrel pattern MP in the first direction D1, and the fourth end E22 of each of the mandrel patterns MP may be an end of the mandrel pattern MP in the third direction D3. In addition, each of the mandrel patterns MP covers all of the stripe patterns 100S in the same row. The third end E21 of each of the mandrel patterns MP is aligned with the first end E11 of the stripe pattern 100S covered by the mandrel pattern MP in the second direction D2, and the fourth end E22 of each of the mandrel patterns MP is aligned with the second end E12 of the stripe pattern 100S covered by the mandrel pattern MP in the second direction D2. For example, when there are two stripe patterns 100S located in one row, the third end E21 of the mandrel pattern MP corresponding to this row is aligned with the first end E11 of the stripe pattern 100S adjacent to the third end E21 (such as the stripe pattern 100S at the leftmost side in FIG. 3) in the second direction D2, and the fourth end E22 of the mandrel pattern MP corresponding to this row is aligned with the second end E12 of the stripe pattern 100S adjacent to the fourth end E22 (such as the stripe pattern 100S at the rightmost side in FIG. 3) in the second direction D2. In addition, two of the stripe patterns 100S are located adjacent to each other in the second direction D2, one of the two strip patterns 100S overlaps one of the mandrel patterns MP, and the other one of the two stripe patterns 100S does not overlap the mandrel patterns MP. In other words, the mandrel patterns MP may be formed corresponding to the stripe patterns 100S located at the odd rows or the stripe patterns 100S located at the even rows. In the layout pattern 100, the first ends E11 of the stripe patterns 100S located at the side adjacent to a region that the first direction D1 points towards in each rows may not be aligned with one another in the second direction D2, and the second ends E12 of the stripe patterns 100S located at the side adjacent to a region that the third direction D2 points towards in each rows may not be aligned with one another in the second direction D2. Therefore, the ends of at least two of the mandrel patterns MP in the first direction D1 (i.e. the third ends E21) may not be aligned with each other in the second direction D2, and the ends of at least two of the mandrel patterns MP in the third direction D3 (i.e. the fourth ends E22) may not be aligned with each other in the second direction D2.

However, there will be too many redundant pattern structures formed by a multiple patterning process, such as a self-aligned double patterning (SADP) process, using a photomask made by the mandrel patterns MP when the ends of the mandrel patterns MP in the first direction D1 and the second direction D2 are not aligned with one another, and that will generate negative influences on operations of a device formed by the multiple patterning process. Therefore, as shown in FIG. 1, FIG. 3, and FIG. 4, step S13 may be carried out subsequently for performing a modification to the mandrel patterns MP for elongating at least a part of the mandrel patterns MP in the first direction D1. The third ends E21 of the mandrel patterns MP in the first direction D1 are aligned with one another in the second direction D2 after the modification. Additionally, in some embodiments, the modification performed to the mandrel patterns MP may further include elongating at least apart of the mandrel patterns MP in the third direction D3, and the fourth ends E22 of the mandrel patterns MP in the third direction D3 may be aligned with one another in the second direction D2 after the modification. Each of the mandrel patterns MP may become a modified mandrel pattern MP' after the modification described above, lengths of the modified mandrel patterns MP' in the first direction D1 may be equal to one another. Relatively, at least two of the mandrel patterns may have different lengths in the first direction D1 before the modification described above. In the modification, the elongation of each of the mandrel patterns MP in the first direction D1 and/or the third direction D3 will not go beyond the range of the stripe patterns 100S in the original layout pattern 100. For example, after the modification described above, the third end E21 of each of the modified mandrel patterns MP' in the first direction D1 and the first end E11 of one of the stripe patterns 100S (such as the stripe pattern 100S at the leftmost side in FIG. 3 and FIG. 4) in the first direction D1 may be aligned with each other in the second direction D2 and overlap each other in the second direction D2, and the fourth end E22 of each of the modified mandrel patterns MP' in the third direction D3 and the second end E12 of one of the stripe patterns 100S (such as the stripe pattern 100S at the rightmost side in FIG. 3 and FIG. 4) in the first direction D1 may be aligned with each other in the second direction D2 and overlap each other in the second direction D2, but not limited thereto.

Subsequently, as shown in FIG. 1, FIG. 4, and FIG. 5, after the modification described above, step S14 is carried out for outputting the mandrel patterns MP (i.e. the modified mandrel patterns MP') to a photomask 200. In the photomask 200, the mandrel patterns MP may be formed on a transparent substrate 210, and the mandrel patterns MP formed on the transparent substrate 210 may be light-shielding patterns, but not limited thereto. In some embodiments, the mandrel patterns MP formed on the transparent substrate 210 may be transparent patterns, and the region outside the mandrel patterns MP on the transparent substrate 210 may be a light-shielding pattern. The light-shielding pattern described above may include light-absorbing material, light-blocking material or other materials capable of altering the light transmittance and/or the light path of the exposure light source used in the exposure process required for the photomask 200, and opaque materials such as chromium or resin or translucent materials such as molybdenum silicide may be used to form the light-shielding pattern described above, but not limited thereto. Additionally, in some embodiments, the light-transmitting pattern described above may be fully pervious to light or partially pervious to light.

As shown in FIG. 1 and FIGS. 5-14, step S15 is then carried out for performing a photolithography process using the photomask 200 for forming a patterned structure 301 on a substrate 10. The photolithography process in this embodiment may include a self-aligned double patterning (SADP) process or other suitable photolithography processes. Specifically, the photolithography process in this embodiment may include but is not limited to the following steps. Firstly, as shown in FIGS. 5-8, a mask layer 30 is formed on the substrate 10, and a material layer 40 is formed on the mask layer 30. The mandrel patterns MP on the photomask 200 is transferred to the material layer 40, and the material layer 40 may be patterned to be mandrels 40M on the mask layer 30. Additionally, in some embodiments, an insulation layer 20 may be formed on the substrate 10 before the step of forming the mask layer 30, and the mask layer 30 may be located between the insulation layer 20 and the material layer 40 in a thickness direction of the substrate 10 (such as a fourth direction D4 shown in FIGS. 6-8), but not limited thereto. The substrate 10 may include a semiconductor substrate or a non-semiconductor substrate. The semiconductor substrate mentioned above may include a silicon substrate, an epitaxial silicon substrate, a silicon germanium substrate, a silicon carbide substrate, a silicon-on-insulator (SOI) substrate, or substrates formed by other suitable semiconductor materials. The none-semiconductor substrate mentioned above may include a glass substrate, a ceramic substrate, a plastic substrate, or substrates formed by other suitable non-semiconductor materials. The insulation layer 20 may include silicon oxide, silicon nitride, silicon oxynitride, silicon carbonitride, or other suitable insulation materials. The mask layer 30 may be a single layer structure or a multiple layer structure of mask materials, and the mask material may include a conductive material and/or an insulation material, such as silicon oxide, silicon nitride, silicon oxynitride, silicon carbonitride, amorphous silicon, or polysilicon. The material layer 40 may include a dielectric material such as an organic dielectric layer (ODL) or other suitable materials. The mandrel patterns MP on the photomask 200 may be transferred to the substrate 10 for forming the mandrels 40M by forming a photoresist layer (not shown) or other photo-patternable materials on the material layer 40, transferring the mandrel patterns MP on the photomask 200 to a patterned photoresist layer on the material layer 40 by an exposure process and a develop process, and performing an etching process to the material layer 40 with the patterned photoresist layer, but not limited thereto. In other words, the mandrels 40M formed on the mask layer 30 are formed corresponding to the mandrel patterns MP on the photomask 200, and the shape of the mandrels 40M may be identical to the shape of the mandrel patterns MP on the photomask 200. After the step of forming the mandrels 40M, a plurality of spacers 50S may be formed on the mask layer 30. Each of the spacers 50S may be formed on a sidewall of one of the mandrels 40M. The step of forming the spacers 50S may include but is not limited to the following steps. Firstly, a spacer material layer 50 is conformally formed on the mask layer 30 and the mandrels 40M. An etching back process is then performed to the spacer material layer 50 for forming the spacers 50S. In other embodiments of the present invention, the spacers 50S may also be formed by other methods different from the method described above according to some considerations.

As shown in FIGS. 7-10, the mandrels 40M are removed after the step of forming the spacers 50S, and a cut pattern 60P is then formed on a part of the spacers 50S and the mask layer 30. A part of the cut pattern 60P may be formed corresponding to the space between different stripe patterns 100S at the same row in the layout pattern 100 shown in FIG. 2, but not limited thereto. In addition, the cut pattern 60P may include a photoresist layer 60 or other photo-patternable materials for reducing the influence of the process of forming the cut pattern 60P on the spacers 50S. As shown in FIGS. 9-12, a first etching process 91 with the spacers and the cut pattern as a mask is then performed to the mask layer 30, and the mask layer 30 may be etched to be a patterned mask layer 30P. Subsequently, as shown in FIGS. 11-14, in some embodiments, a second etching process 92 with the patterned mask layer 30P as a mask may be performed to the insulation layer 20 for forming a plurality of first trenches TR1 in the insulation layer 20. The first trenches TR1 may then be filled with a conductive material 70 for forming a plurality of conductive lines 71 in the first trenches TR1. The conductive material 70 may include aluminum (Al), tungsten (W), copper (Cu), titanium (Ti), titanium aluminide (TiAl), titanium nitride (TiN), tantalum (Ta), tantalum nitride (TaN), tungsten silicide (WSi), tungsten nitride (WN), or other suitable conductive materials. In some embodiments, the conductive material 70 may be formed on the insulation layer 20, each of the first trenches TR1 may be fully filled with the conductive material 70, and the conductive material 70 outside the first trenches TR1 may then be removed by a planarization process, such as a chemical mechanical polishing (CMP) process, and/or an etching back process for forming the conductive lines 71, but not limited thereto. Each of the conductive lines 71 may be formed in one of the first trenches TR1, and the patterned structure 301 described above may include the conductive lines 71. As shown in FIG. 13 and FIG. 2, at least one of the conductive lines 71 may include a main part 71A and a dummy part 71B. The main part 71A is formed corresponding to one of the stripe patterns 100S in the layout pattern 100. The dummy part 71B is connected with the main part 71A, and the dummy part 71B is not corresponding to the stripe patterns 100S. In other words, the shape of the shape of the patterned structure 301 formed by the patterning method in this embodiment may be different from the shape of the layout pattern 100. However, the problem that too many redundant pattern structures are formed by a multiple patterning process using a photomask made by mandrel patterns which are not aligned with one another may be improved by the patterning method in this embodiment, and the design flexibility of the layout pattern 100 corresponding to the patterning method may be enhanced accordingly. In addition, the dummy parts 71B of different conductive lines 71 may be separated from one another for reducing the negative influence of the dummy parts 71B.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 15:
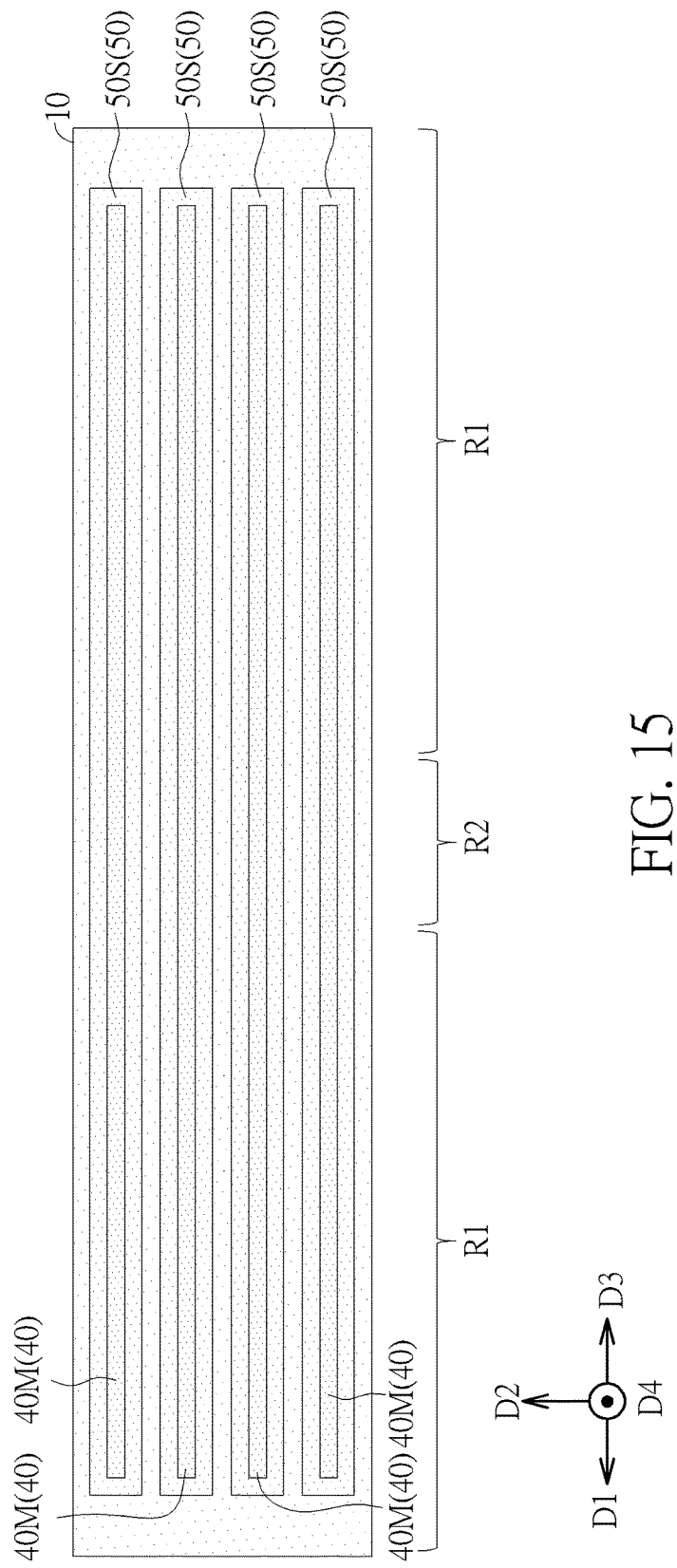
Figure 16:
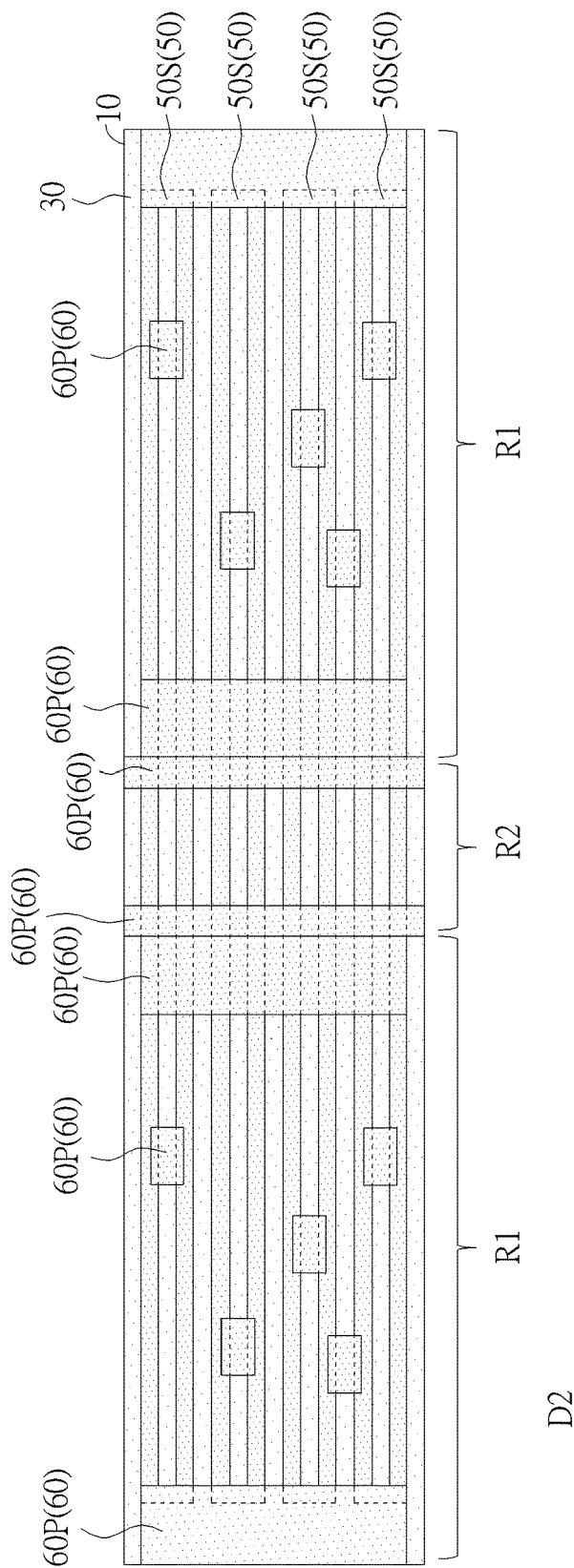
Figure 17:
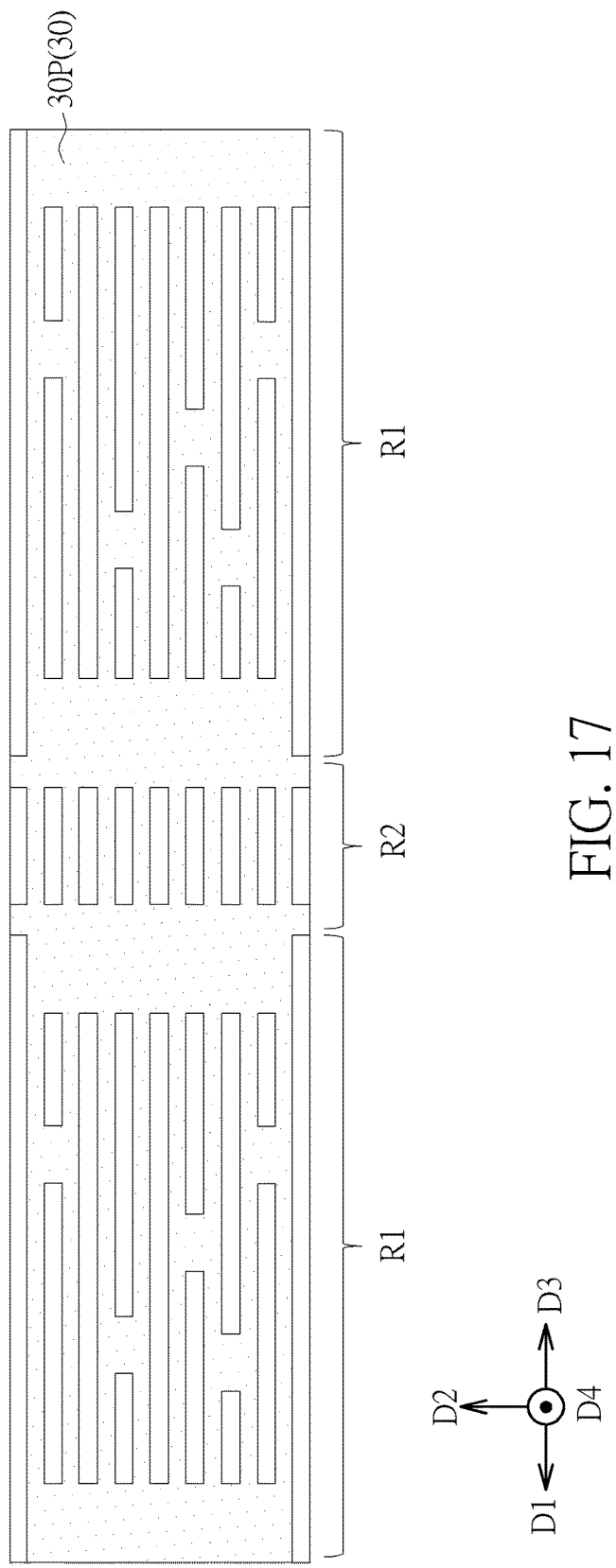
Figure 18:
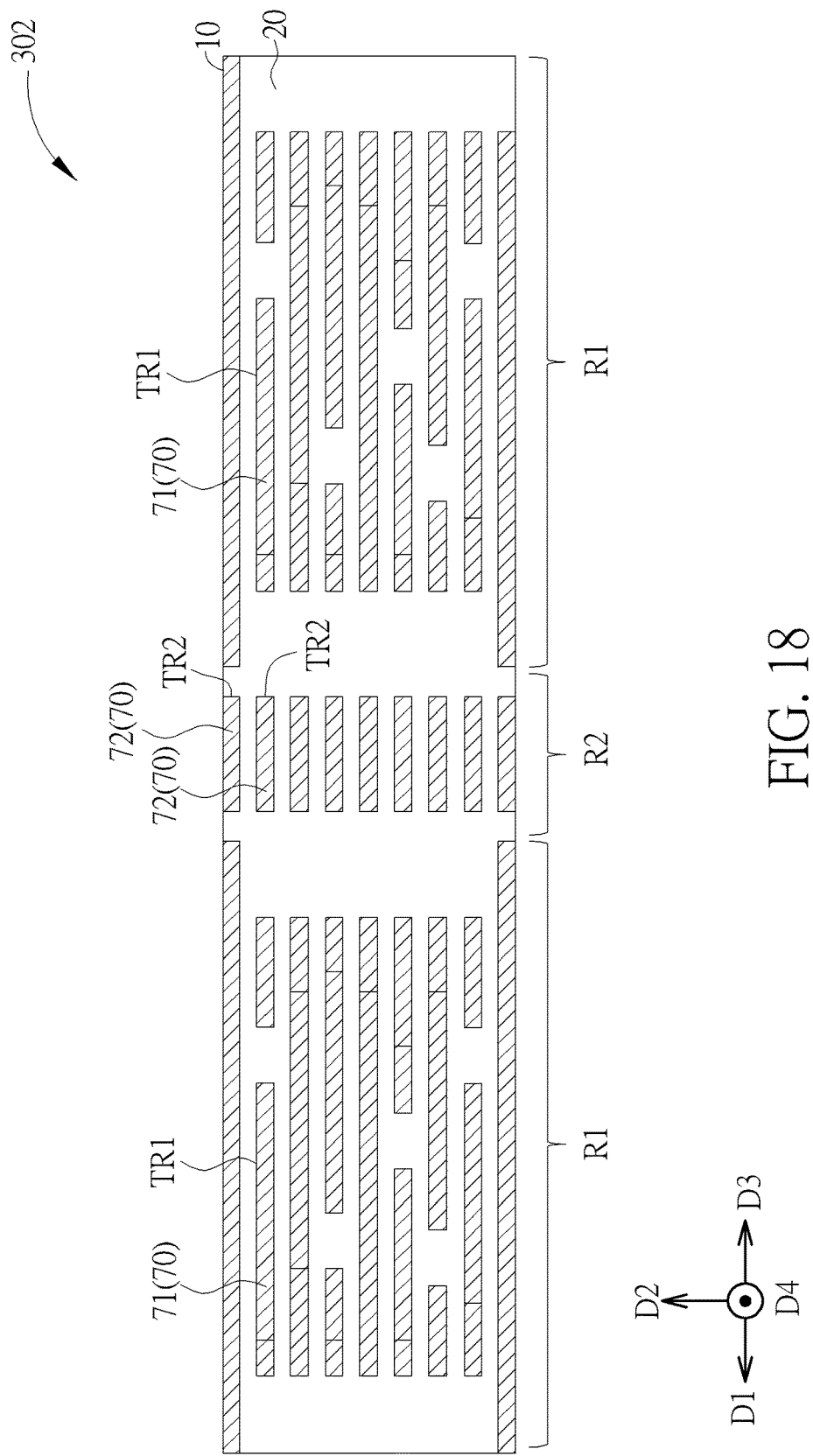

Please refer to FIGS. 15-18 and FIGS. 7-14. FIGS. 15-18 are schematic drawings illustrating a patterning method according to a second embodiment of the present invention, wherein FIG. 16 is a schematic drawing in a step subsequent to FIG. 15, FIG. 17 is a schematic drawing in a step subsequent to FIG. 16, and FIG. 18 is a schematic drawing in a step subsequent to FIG. 17. As shown in FIG. 15, a first region R1 and a second region R2 may be defined on the substrate 10 in this embodiment, and the first region R1 is located adjacent to the second region R2 in the first direction D1. In some embodiments, the first region R1 may be regarded as a main circuit region, the second region R2 may be regarded as an isolation dummy region between the main circuit regions adjacent to each other, and the conductive lines 71 of the first embodiment described above and shown in FIG. 13 and FIG. 14 may be formed in the first region R1, but not limited thereto. The mandrels 40M in this embodiment may be formed on the first region R1 and the second region R2. As shown in FIG. 15, in this embodiment, the spacers 50S formed on the sidewalls of the mandrels 40M may be formed on the first region R1 and the second region R2 also because the mandrels 40M may be formed on the first region R1 and the second region R2. Subsequently, as shown in FIGS. 15-17, similar to the process of the first embodiment described above in FIGS. 7-12, the mask layer 30 is etched by using the spacers 50S and the cut pattern 60P as a mask for forming the patterned mask layer 30P after the step of removing the mandrels 40M. As shown in FIG. 17 and FIG. 18, similar to the process of the first embodiment described above in FIGS. 11-14, the insulation layer 20 is then etched by using the patterned mask layer 30P as a mask for forming a plurality of the first trenches TR1 in the insulation layer 20 on the first region R1 and forming a plurality of second trenches TR2 in the insulation layer 20 on the second region R2. In other words, the first trenches TR1 are formed on the first region R1 and the second trenches TR2 are formed on the second region R2. Subsequently, the first trenches TR1 and the second trenches TR2 are filled with the conductive material 70 for forming the conductive lines 71 in the first trenches TR1 and forming a plurality of dummy patterns 72 in the second trenches TR2. A patterned structure 302 may be formed on the substrate 10 by the patterning method of this embodiment, and the patterned structure 302 may include the conductive lines 71 and the dummy patterns 72. It is worth noting that the shape of the dummy pattern 72 may be similar to the shape of the conductive line 71 because the dummy patterns 72 are formed by the mandrels described above also. Each of the dummy patterns 72 may extend in the first direction D1 also, but each of the dummy patterns 72 is separated from the conductive lines 71. By elongating the mandrels from the first region R1 to the second region R2 and forming the dummy patterns 72 in the second region R2 by the mandrels, the distribution density of the conductive material 70 in the insulation layer 20 above the substrate 10 may be improved, and that will benefit the uniformity of the above-mentioned planarization process performed for forming the conductive lines 71.

Figure 19:
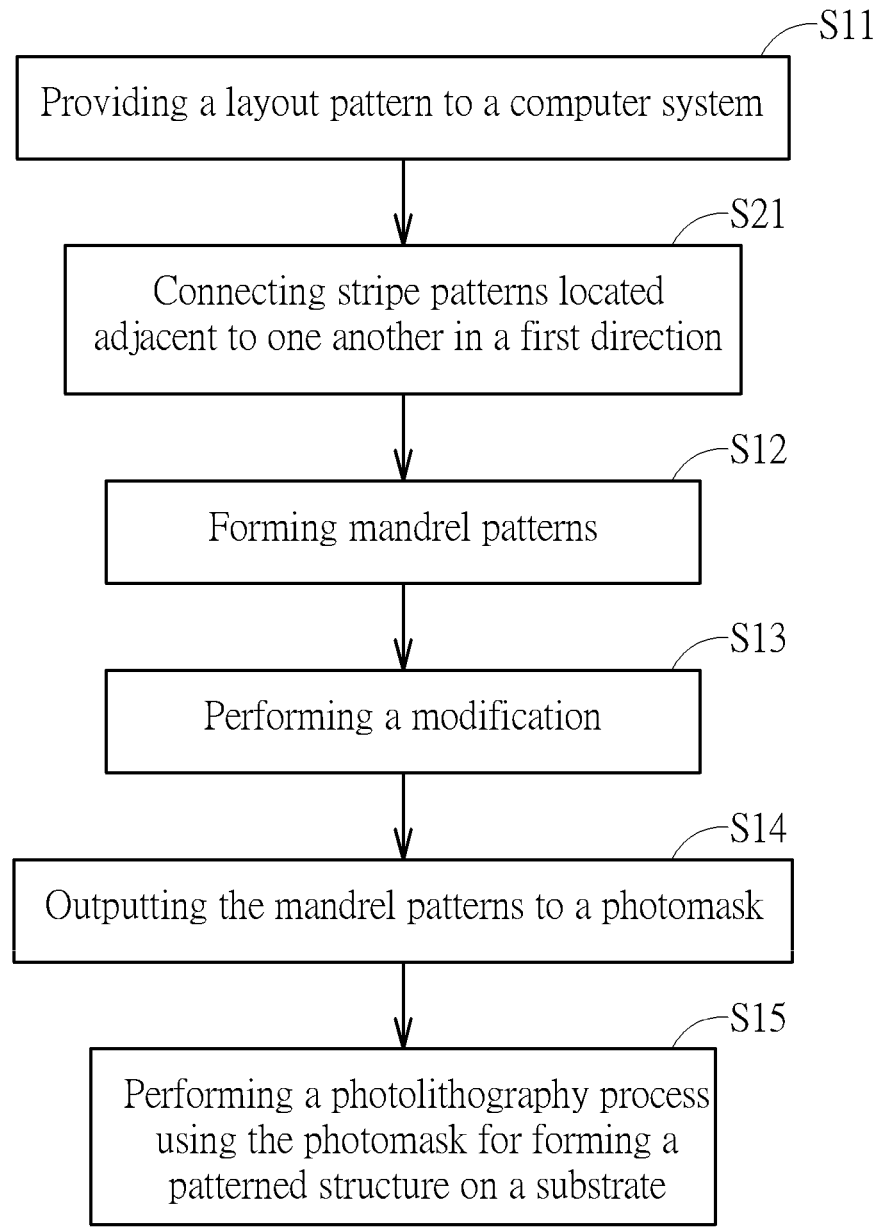
FIG. 19 is a flow chart of a patterning method according to a third embodiment of the present invention.
Figure 20:
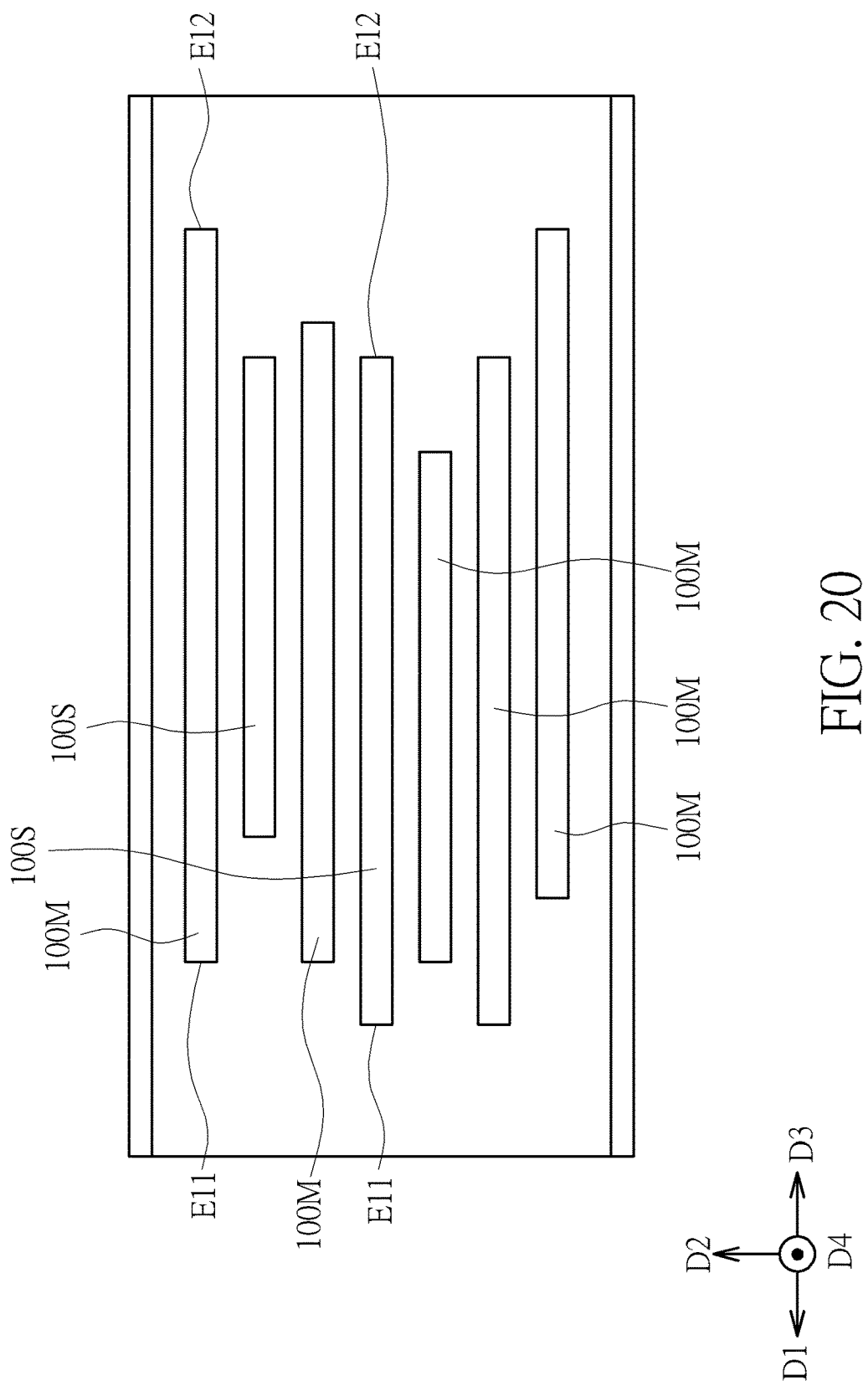
Figure 21:
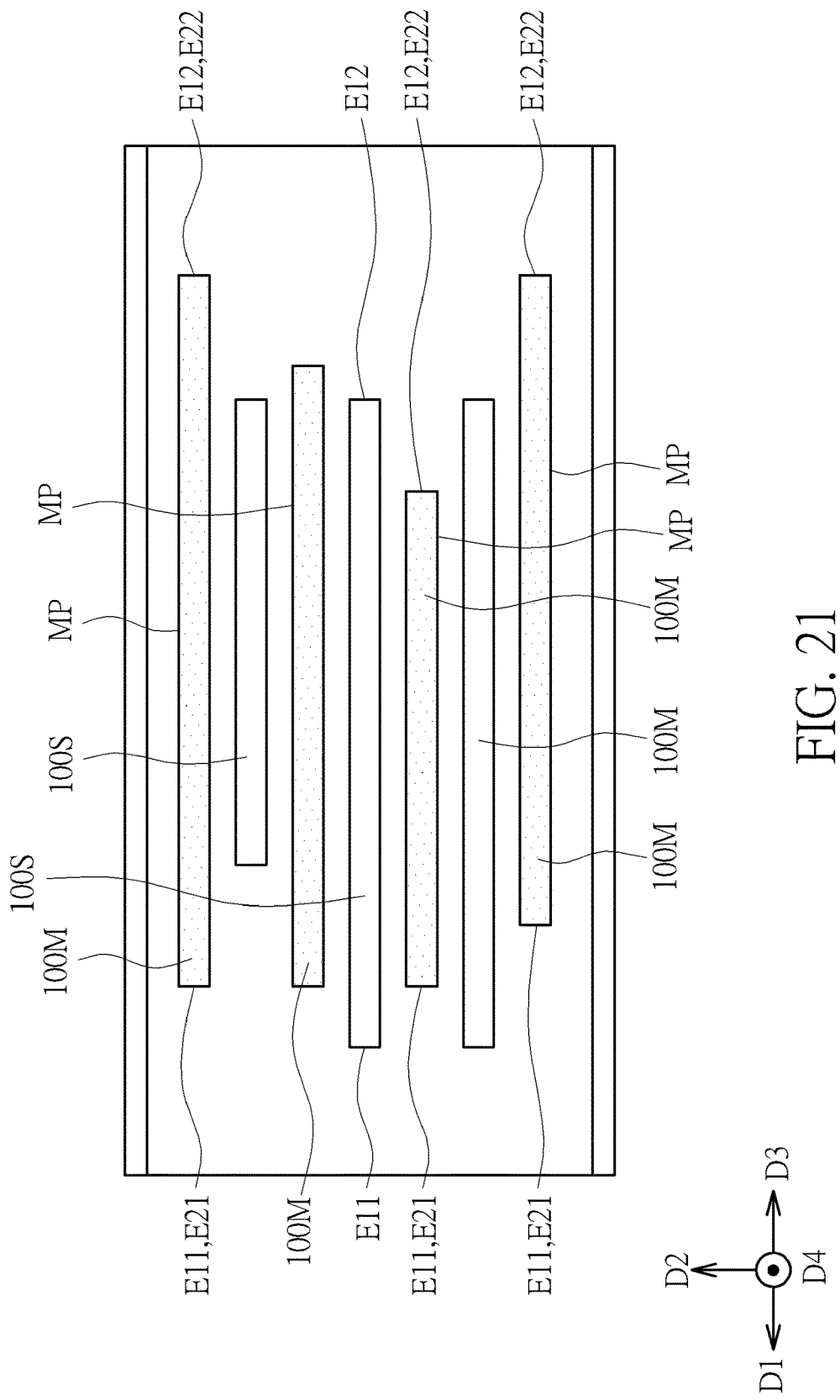
Figure 22:
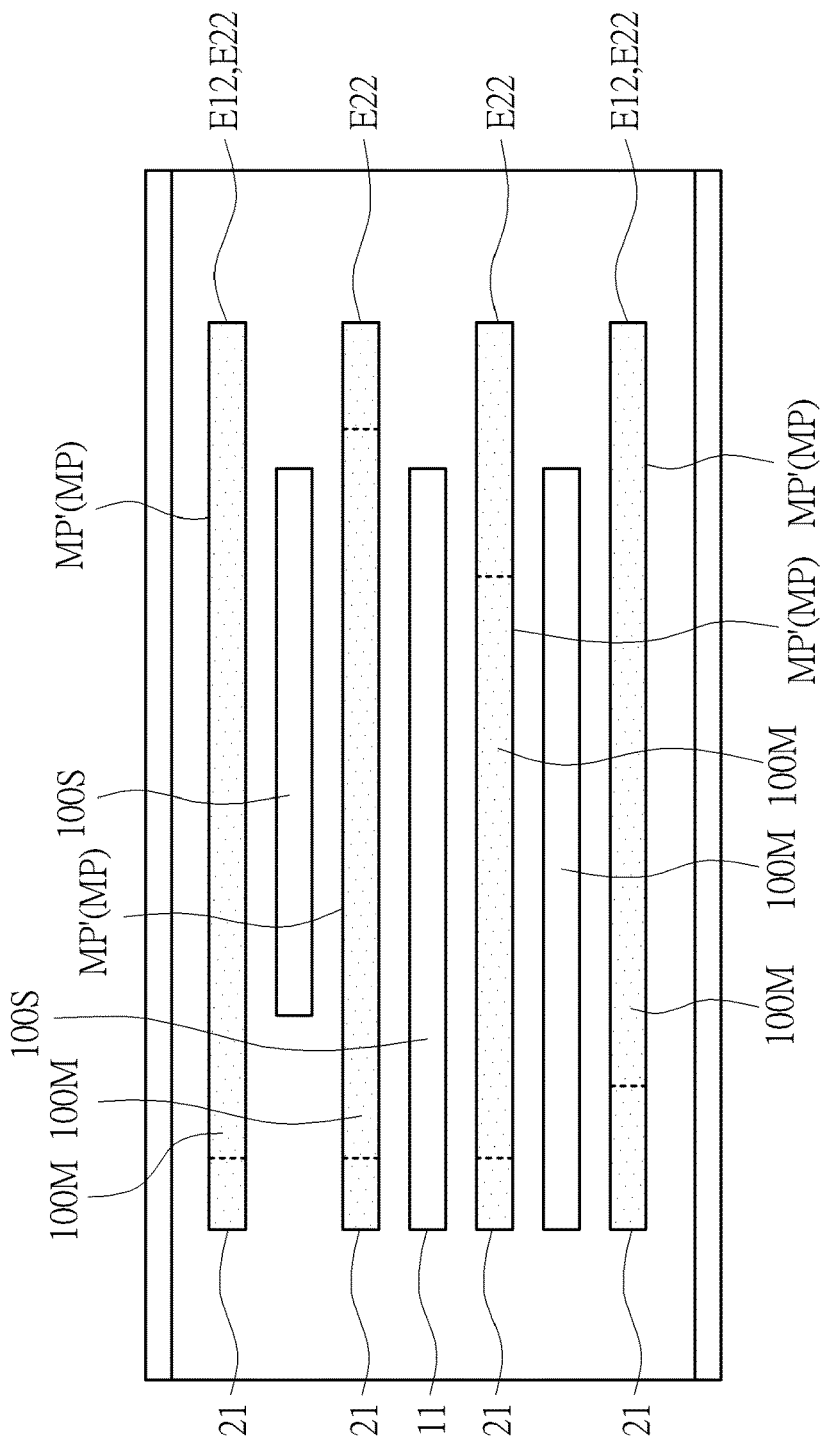

Please refer to FIGS. 19-22 and FIG. 2. FIGS. 20-22 are schematic drawings illustrating the patterning method according to the third embodiment of the present invention, wherein FIG. 21 is a schematic drawing in a step subsequent to FIG. 20, and FIG. 22 is a schematic drawing in a step subsequent to FIG. 21. Additionally, FIG. 20 may be regarded as a schematic drawing in a step subsequent to FIG. 2. As shown in FIG. 19, FIG. 2, and FIG. 20, in the patterning method of this embodiment, step S21 may be carried out before the step of forming the mandrel patterns described above for connecting the stripe patterns 100S located adjacent to one another in the first direction D1 to be a modified stripe pattern 100M. As shown in FIGS. 19-21, the mandrel patterns MP may be formed after step S21, and at least one of the mandrel patterns MP is formed corresponding to the modified stripe pattern 100M. In other words, there will be only one modified stripe pattern 100M in each row after step S21. The first end E11 of each of the modified stripe patterns 100M may be the end of the row in the first direction D1, and the second end E12 of each of the stripe patterns 100M may be the end the row in the third direction D3. In the layout pattern 100, the first ends E11 of the stripe patterns 100S located at the side adjacent to a region that the first direction D1 points towards in each rows may not be aligned with one another in the second direction D2, and the second ends E12 of the stripe patterns 100S located at the side adjacent to a region that the third direction D2 points towards in each rows may not be aligned with one another in the second direction D2. Therefore, the first ends E11 of at least two of the modified stripe patterns 100M are not aligned with each other in the second direction D2, and the second ends E12 of at least two of the modified stripe patterns 100M are not aligned with each other in the second direction D2 also. At least two of the modified stripe patterns 100M may have different lengths in the first direction D1. Two of the modified stripe patterns 100M are located adjacent to each other in the second direction D2, one of the two modified stripe patterns 100M overlaps one of the mandrel patterns MP, and the other one of the two modified stripe patterns 100M does not overlap the mandrel patterns MP. Each of the mandrel patterns MP covers one of the modified stripe patterns 100M, the third end E21 of each of the mandrel patterns MP is aligned with the first end E11 of the corresponding modified stripe pattern 100M in the second direction D2, and the fourth end E22 of each of the mandrel patterns MP is aligned with the second end E12 of the corresponding modified stripe pattern 100M in the second direction D2. Therefore, the third ends E21 of at least two of the mandrel patterns MP in the first direction D1 are not aligned with each other in the second direction D2, and the fourth ends E22 of at least two of the mandrel patterns MP in the third direction D3 are not aligned with each other in the second direction D2. Subsequently, as shown in FIG. 19, FIG. 21, and FIG. 22, step S13 is carried out for performing a modification to the mandrel patterns MP for elongating at least a part of the mandrel patterns MP in the first direction D1 and/or the third direction D3. The third ends E21 of the mandrel patterns MP in the first direction D1 are aligned with one another in the second direction D2 after the modification, and the fourth ends E22 of the mandrel patterns MP in the third direction D3 are aligned with one another in the second direction D2 after the modification.

To summarize the above descriptions, in the patterning method of the present invention, the modification may be performed to the mandrel patterns for elongating at least apart of the mandrel patterns, and the ends of the mandrel patterns are aligned with one another after the modification. The problem that too many redundant pattern structures are formed by the multiple patterning process using the photomask made by mandrel patterns which are not aligned with one another may be improved by the patterning method of the present invention, and the design flexibility of the layout pattern corresponding to the patterning method may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A patterning method, comprising:
   providing a layout pattern to a computer system, wherein the layout pattern comprises stripe patterns, and each of the stripe patterns extends in a first direction;
   forming mandrel patterns corresponding to a part of the stripe patterns, wherein each of the mandrel patterns extends in the first direction;
   performing a modification to the mandrel patterns for elongating at least a part of the mandrel patterns in the first direction, wherein ends of the mandrel patterns in the first direction are aligned with one another in a second direction perpendicular to the first direction after the modification;
   outputting the mandrel patterns to a photomask after the modification; and
   performing a photolithography process using the photomask for forming a patterned structure on a substrate.

2. The patterning method according to claim 1, wherein the ends of at least two of the mandrel patterns in the first direction are not aligned with each other before the modification.

3. The patterning method according to claim 1, wherein the modification performed to the mandrel patterns further comprises:
   elongating at least a part of the mandrel patterns in a third direction opposite to the first direction, wherein ends of the mandrel patterns in the third direction are aligned with one another in the second direction after the modification.

4. The patterning method according to claim 3, wherein the ends of at least two of the mandrel patterns in the third direction are not aligned with each other before the modification.

5. The patterning method according to claim 1, wherein the photolithography process comprises:
   forming a mask layer on the substrate;
   forming a material layer on the mask layer; and
   transferring the mandrel patterns on the photomask to the material layer, wherein the material layer is patterned to be mandrels on the mask layer.

6. The patterning method according to claim 5, wherein the photolithography process further comprises:
   forming spacers on the mask layer, wherein each of the spacers is formed on a sidewall of one of the mandrels;
   removing the mandrels after the step of forming the spacers;
   forming a cut pattern on a part of the spacers and the mask layer; and
   etching the mask layer with the spacers and the cut pattern as a mask, wherein the mask layer is etched to be a patterned mask layer.

7. The patterning method according to claim 6, wherein the photolithography process further comprises:
   forming an insulation layer on the substrate before the step of forming the mask layer;
   etching the insulation layer with the patterned mask layer as a mask for forming first trenches in the insulation layer; and
   filling the first trenches with a conductive material for forming conductive lines in the first trenches, wherein the patterned structure comprises the conductive lines.

8. The patterning method according to claim 7, wherein at least one of the conductive lines comprises:
   a main part formed corresponding to one of the stripe patterns in the layout pattern; and
   a dummy part connected with the main part, wherein the dummy part is not corresponding to the stripe patterns.

9. The patterning method according to claim 7, wherein a first region and a second region adjacent to the first region in the first direction are defined on the substrate, and the mandrels are formed on the first region and the second region.

10. The patterning method according to claim 9, wherein the first trenches and the conductive lines are formed on the first region, and the photolithography process further comprises:
    forming second trenches in the insulation layer, wherein the second trenches are formed on the second region; and
    filling the second trenches with the conductive material for forming dummy patterns in the second trenches, wherein the dummy patterns are separated from the conductive lines, and each of the dummy patterns extends in the first direction.

11. The patterning method according to claim 1, wherein the shape of the patterned structure is different from the shape of the layout pattern.

12. The patterning method according to claim 1, wherein the end of each of the mandrel patterns in the first direction and an end of one of the stripe patterns in the first direction are aligned with each other in the second direction and overlap each other in the second direction after the modification.

13. The patterning method according to claim 12, wherein an end of each of the mandrel patterns in a third direction opposite to the first direction and an end of one of the stripe patterns in the third direction are aligned with each other in the second direction and overlap each other in the second direction after the modification.

14. The patterning method according to claim 1, wherein two of the stripe patterns are adjacent to each other in the second direction, ends of the two stripe patterns in the first direction are not aligned with each other in the second direction, and ends of the two stripe patterns in a third direction opposite to the first direction are not aligned with each other in the second direction.

15. The patterning method according to claim 1, wherein two of the stripe patterns are adjacent to each other in the second direction, one of the two stripe patterns adjacent to each other in the second direction overlaps one of the mandrel patterns, and the other one of the two stripe patterns adjacent to each other in the second direction does not overlap the mandrel patterns.

16. The patterning method according to claim 1, wherein some of the stripe patterns are located adjacent to one another in the first direction, and the patterning method further comprising:
   connecting the stripe patterns located adjacent to one another in the first direction to be a modified stripe pattern before the step of forming the mandrel patterns, wherein at least one of the mandrel patterns is formed corresponding to the modified stripe pattern.

17. The patterning method according to claim 1, wherein the photolithography process comprises a self-aligned double patterning (SADP) process.

* * * * *